United States Patent [19]

Ikegaya et al.

[11] Patent Number: 5,112,643
[45] Date of Patent: May 12, 1992

[54] GASEOUS PHASE SYNTHESIZED DIAMOND AND METHOD FOR SYNTHESIZING SAME

[75] Inventors: Akihiko Ikegaya; Masaaki Tobioka, both of Itami, Japan

[73] Assignee: Sumitomo Electric Industries, Ltd., Osaka, Japan

[21] Appl. No.: 754,318

[22] Filed: Sep. 4, 1991

Related U.S. Application Data

[60] Continuation of Ser. No. 392,286, Aug. 11, 1989, abandoned, which is a division of Ser. No. 76,721, Jul. 22, 1987, Pat. No. 4,900,628.

[30] Foreign Application Priority Data

Jul. 23, 1986 [JP] Japan .................................. 61-173365
Mar. 27, 1987 [JP] Japan .................................. 62-75282
May 13, 1987 [JP] Japan .................................. 62-116598

[51] Int. Cl.$^5$ ...................... C23C 16/26; C23C 16/48; C23C 16/50
[52] U.S. Cl. ........................................ 427/38; 427/39; 427/42; 427/249; 423/446
[58] Field of Search ............ 427/38, 39, 42, 249; 423/446

[56] References Cited

U.S. PATENT DOCUMENTS 4,734,339 3/1988 Schachner et al. ............ 428/472 X
4,740,263 4/1988 Imai et al. .......................... 427/42

FOREIGN PATENT DOCUMENTS 59-232991 12/1984 Japan .

OTHER PUBLICATIONS

Sawabe et al, "Growth of Diamond Thin Films by Electron Assisted CVD", *Applied Physics Letters*, 1985.
Matsumoto et al, "Growth of Diamond Particles from Methane Hydrogen Gas", Nat Inst. for Research in Inorg. Mat., Japan J. of Materials Science 17 (1982) 3106–3112.

*Primary Examiner*—Michael Lusignan
*Assistant Examiner*—Margaret Burke
*Attorney, Agent, or Firm*—Wenderoth, Lind & Ponack

[57] ABSTRACT

The present invention relates to gaseous phase synthesized diamond and a method for synthesizing the same. In order to obtain crystalline diamond having remarkably high completeness and hardly containing carbon having a construction other than that of diamond, raw material gases are thermally activated by a thermoelectron-radiating material heated at an extremely high temperature, the thermoelectron-radiating material being connected to a negative pole while a substrate to be coated is connected to a positive pole, by the use of a direct current power source, a plasma being formed between the thermoelectron-radiating material and the substrate and the substrate by applying a direct current voltage, and a diamond film having an average particle size of 2 microns or less, compression residual stress and electric resistance of $10^8$ ohm.cm or more being formed on the substrate by using the activation by the thermoelectron-radiating material together with the activation by the formation of DC plasma.

In addition, homogeneous diamond particles uniform in shape can be obtained by using this method.

6 Claims, 3 Drawing Sheets

RAMAN SPECTRA FROM
THE DEPOSITED LAYER

GASEOUS PHASE SYNTHESIZED DIAMOND AND METHOD FOR SYNTHESIZING SAME

This application is a continuation of now abandoned application, Ser. No. 07/392,286 filed on Aug. 11, 1989, which was a divisional of Ser. No. 07/76,721 filed on Jul. 22, 1987, U.S. Pat. No. 4,900,628.

DETAILED DESCRIPTION OF THE INVENTION

1. Fields of Industrial Use

Figure 1:
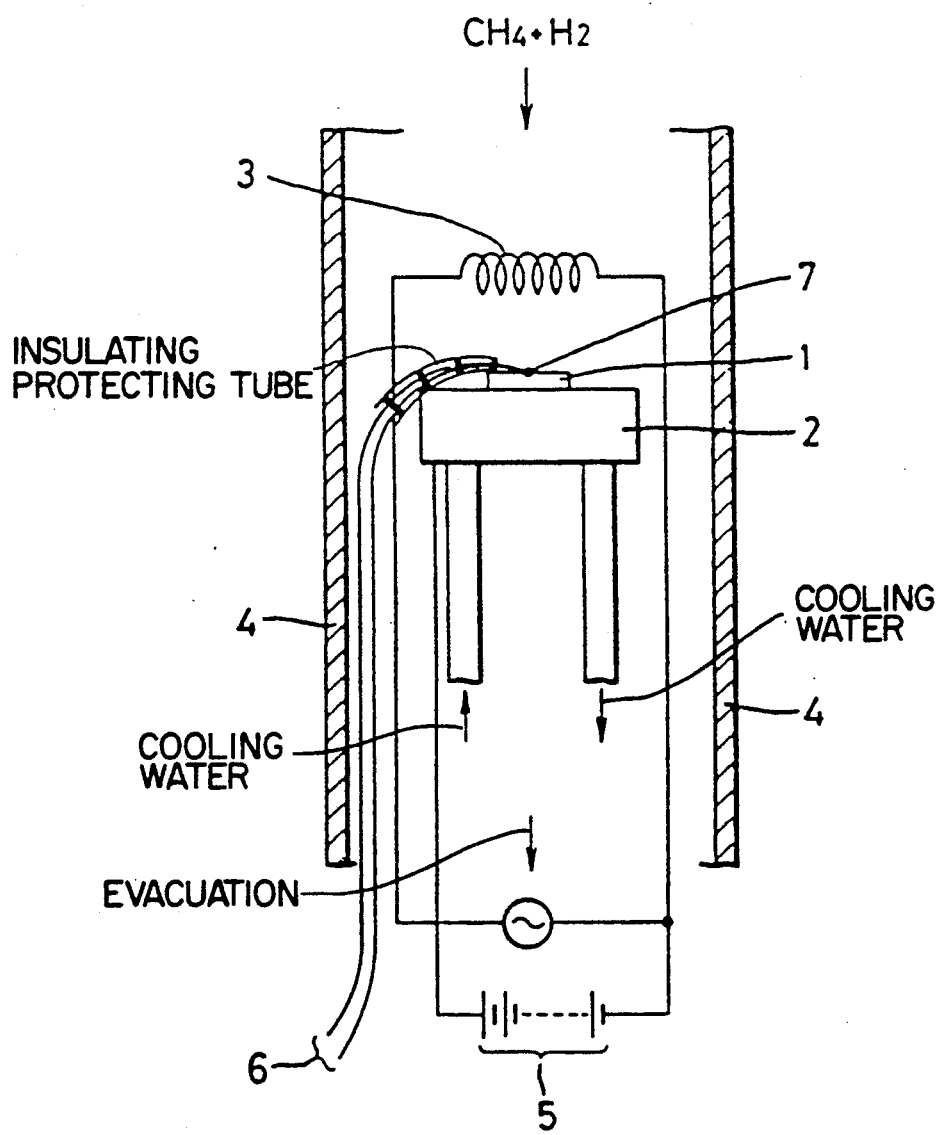

The present invention relates to gaseous phase synthesized diamond and a method for synthesizing the same, in particular to crystalline diamond having a remarkably high completeness and hardly containing carbon having a construction other than that of diamond, and a method for synthesizing the same.

In addition, the present invention relates to a high-speed synthesis of a diamond film capable of coating diamond at a high-speed 10 times to several tens times the deposition speed of diamond in the prior art.

2. Prior Art

Diamond has been synthesized at high temperatures and pressures and as a result, its manufacturing cost has been high. However, recently, a low-pressure gaseous phase synthesizing method, in which diamond is synthesized at low pressures without using high pressures, has been developed.

The following gaseous phase diamond-synthesizing methods have been known.

(1) High-frequency plasma CVD methods using a plasma disclosed in Japanese Patent Publication Laid-Open No. Sho 58-135117, Japanese Patent Application No. Sho 61-8458, 61-8459 and the like, and microwave plasma CVD methods discolsed in Japanese Patent Publication Laid-Open No. Sho 58-110494, 59-3098 and U.S. Pat. No. 4,434,188.

(2) An ionization vapor deposition method and an ion beam vapor deposition method using ion particles.

(3) A thermoelectron radiation CVD method using neutral particles disclosed in Japanese Patent Publication Laid-Open No. Sho 58-91100.

(4) CVD method using an electron shock disclosed in Japanese Patent Publication Laid-Open No. Sho 60-221395 and European Patent Publication Laid-Open No. 161,829.

Of these, methods (1) and (3) are capable of synthesizing a crystalline diamond film while method (2) is capable of obtaining an amorphous diamond-like carbon film. In addition, method (4) is superior to other methods and characterized by the fact that the growth speed of the diamond film is large, to an extent of 3 to 5 microns/hr, and the initial diamond nucleus-forming speed is increased.

However, this applies in the case where a ratio of $CH_4$ to $H_2$ by volume, that is to say $CH_4/H_2$, is increased. In this case, according to the evaluation by the Raman spectrometric method, problems have occurred in that a peak of 1,550 $cm^{-1}$ relating to amorphous carbon is increased and the the resulting diamond film has a low completeness.

This has been disclosed in J. Appl. Phys. 55 page 640 (1986).

Also film growth speed is insufficient for the provision of a bulk material.

As to a crystalline diamond film, energetic investigation has been conducted for application of such a film to a surface coating of abrasion-resisting parts and a surface coating film of cutting tools due to a remarkably high hardness, to a heat sink member of a semiconductive device due to high thermal conductivity and to a semiconductive element by doping impurities due to an icreased band gap.

Problems to be Solved by the Invention

Of the above described prior arts, if the microwave plasma CVD method is used, diamond hardly containing carbon (amorphous carbon, graphite and the like) having a construction other than that of diamond discriminated by the Raman spectrometric menthod and the like and having a remarkably large electric resistance and a high completeness can be obtained. However, in a method, in which the microwave nonpolar discharge is produced in a reaction tube vertically passing through a wave-guiding tube, which has been usually used, since a microwave has a short wave length, if a reaction tube having a diameter longer than the wave length of the microwave is used, the microwave can not be blocked but leaks out, so that the size of the reaction tube is restricted by the wave length. Accordingly, naturally, the coating zone can not be widened, whereby mass production becomes difficult.

That is to say, frequencies, which can be industrially used in Japan, are 915 MHz and 2,350 MHz and in the case where these frequencies are used, the diameter of the reaction tube has an upper limit of 120 mm and 50 mm, respectively.

Accordingly, such a method is insufficient for the attainment of a coating zone having such a large area that mass production can be industrially carried out. In addition, in the case of a RF plasma CVD method, it is required for the provision of daimond having a high completeness to generate a plasma having a high strength. In the case of a method for generating a plasma, in which a RF power source is singly used as an excitation source, only an induction-connecting type method can be used.

It may be said in this connection that in a capacity-connecting type method a crystalline diamond is not synthesized but an amorphous diamond is synthesized. That is to say, in the RF induction-connecting type method, in order to obtain a coating zone having a large area, a RF power source of large electric power, which is remarkably difficult to industrially use, is required.

In addition, in CVD method (4), since a shower of electrons is used, an electric power, which can be applied between the filament and the substrate, is limited and film growth speed can not be so increased as in the present invention.

Besides, an electron shock is indispensable in this method, so that if the pressure of an atmosphere is increased, the shower of electrons do not arrive at the substrate, whereby this method has been difficult to realize at a high pressure such as 50 to 500 Torr proposed in the present invention.

On the other hand, in the thermoelectron-radiating material CVD method it is thought that the simultaneous treatment of a large number of substrates and the provision of coating on a large area are possible in principle by selecting a thermoelectron-radiating material having various kinds of shape and using a plurality of thermoelectron-radiating materials, but problems have occurred in that a ratio of carbon other than diamond contained in the synthesized diamond is larger than that in the microwave plasma CVD method, the synthesized diamond being inferior in completeness, and electric resistance being reduced.

On the other hand, a deposition speed of forming diamond having an excellent shape and a high completeness and hardly containing impurities other than diamond is at most 2 microns/hr in the thermoelectron-radiating material CVD method and the microwave plasma CVD method, and 5 microns/hr in the EACVD method for a $H_2$—$CH_4$ raw material gas and the like. In order to obtain diamond having an increased film thickness and polycrystalline diamond in the form of bulk material, a method for synthesizing diamond at higher speed has been eagerly desired.

Measures for Solving the Problems

The present inventors investigated hard to discover a method for synthesizing diamond having mass productivity, which is an adventage of the thermoelectron-radiating CDV method, and a film quality equal to that of diamond obtained by the microwave plasma CVD method, and as a result, the present invention was achieved.

That is to say, the present invention is based on the thermoelectron-radiating material CVD method and could not succeed in the synthesis of a diamond film having a high completeness until a raw material gas is activated by a thermoelectron-radiating material heated at 1,600° C. or more, the thermoelectron-radiating material being connected to a negative pole while a substrate is connected to a positive pole by the use of a DC power source, a plasma being formed, the activation by the thermoelectron-radiating material heated at a high temperature being used together with the activation by the formation of DC plasma, a pressure within a reaction vessel, in which the plasma is formed, being set at 50 Torr or more but 500 Torr or less, and a temperature of gas within the plasma being raised.

The diamond film, on which a broad peak relating to amorphous carbon near 1,550 $cm^{-1}$ as evaluated by Raman spectrometric method is hardly observed and a half value of a peak relating to diamond of 1,334 $cm^{-1}$ is 50 $cm^{-1}$ or less, and in which an average particle size is less than 2 microns, is preferable.

The diamond film, of which surface is mainly a (111)-plane, having an electric resistance of $10^8$ ohm.cm or more is still further preferable.

In addition, the diamond film having a (100)-plane, (110)-plane and the like can be formed according to the conditions but the diamond film having a (111)-plane is desirable for tools. An electric resistance is usually a measure of residual carbon such as amorphous carbon and graphite. The higher an electric resistance is, the smaller is the quantity of residual carbon such as amorphous carbon and graphite.

The diamond film having an electric resistance of $10^{10}$ ohm.cm or more is still further desirable.

In addition, in order to achieve a high-speed coating, the thermoelectron-radiating material is heated at superhigh temperatures of 2,200° C. or more and the DC electric power is applied at a ratio of 50 W/$cm^3$ per unit volume of plasma-forming space or more. Although a surface of the substrate is heated to reach high temperatures, the present inventors succeeded in the high-speed coating of diamond having an excellent shape and remarkably high completeness and hardly containing impurities other than diamond at a ratio of 20 microns/hr or more.

Figure 3:
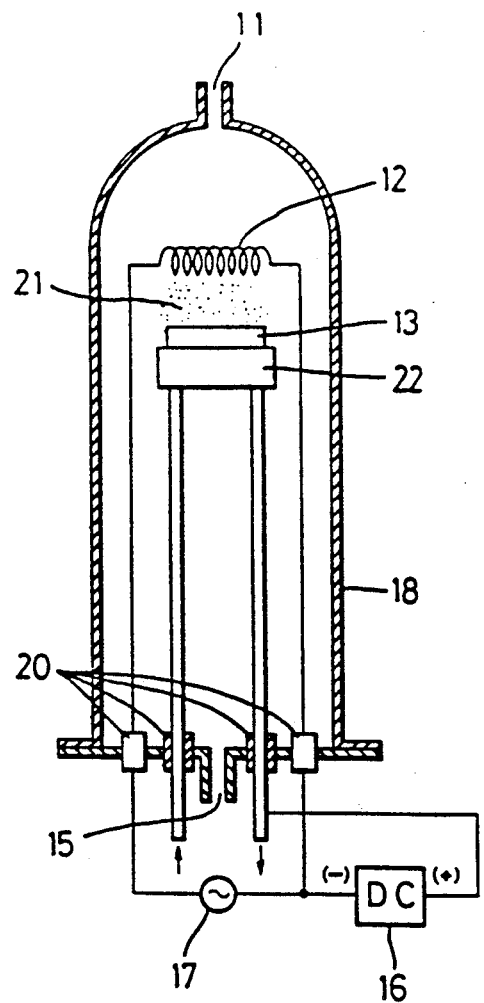

One special feature of the present invention is in the possibility of the control of the substrate by a cooling mechanism incorporated in a substrate-supporting table as shown in FIG. 3.

The above described control of the surface temperature of the substrate at 850° C. or more but 1,200° C. or less is carried out by bringing a CA thermopile fine wire 6 into direct contact with a surface of the substrate 1 on the substrate-supporting table 2, whereby the surface temperature of the substrate can be measured accurately and with good reproducibility. Thus, the diamond film can be coated on the surface of the substrate under the most suitable conditions in good reproducibility. In addition, reference numerals 2, 3 designate a thermoelectron-radiating material, reference numeral 4 designating a transparent quartz tube, and reference numeral 5 designating a direct current power source.

As described above, it is remarkably important for the manufacture of diamond having a high completeness and preferable characteristics ot control the surface temperature of the substrate.

Also, it is remarkably important to control a residual stress of the diamond film.

That is to say, diamond is different from the substrate in thermal expansion coefficient. Accordingly, since the temperature, at which diamond is synthesized, is different from the temperature at which it is really used, residual stress naturally remains in the dimaond film.

In the event that a thermal expansion coefficient of this substrate is larger than that of diamond, compression stress remains in the diamond film.

In the event that a thermal expansion coefficient of the substrate is larger than that of diamond, a residual compression stress is generated in the diamond film, while in the event that the remaining stress is too large, the diamond film is separated from the substrate. This tendency is enhanced with an increase of film-thickness.

An intrinsic remaining stress due to the process is generated in addition to the remaining stress generated from a difference between the substrate and the diamond film in their thermal expansion coefficients. And, in the case where these residual stresses remain to an extent that the separation is generated within a practical use in total, an excellent diamond film can be obtained.

The reason for this has never been made clear.

Another characteristic of the present invention is that in the event that an iron group metal is used as the substrate, graphite-like carbon is deposited but in the event that other substances are used as the substrate, a diamond film having a high adhesion can be obtained.

High-melting point metals, such as V, Nb, Ta, Mo and W, are particularly suitable as the above described other substances in view of the rise of temperature of the substrate.

Also carbides, nitrides and borides of the IVa-, Va- and VIa-group metals, Al and Si can form a diamond film having a high adhesion.

In addition, even in the case of using the iron-group metals, if the above described high-melting point metals and various kinds of compound are preliminarily coated on the substrate, the above described phenonmena incidental to the iron-group metals do not occur.

Besides, in the case of carbide alloys and thermets containing iron-group metals, the coating is carried out without problems if the iron-group metals are used at a ratio of 15% by weight or less.

Still another characteristic of the present invention is that an average particle size of diamond coated on the substrate is 2 microns or less.

According to the method of the present invention, a nuclear-generating density of diamond is remarkably high.

That is to say, a carbon radical having a high energy-level is generated by a DC high-energy density plasma and electrons are emitted from the thermoelectron-radiating material heated at an extremely high temperature, so that the nucleus-generating density of the substrate surface is increased, whereby an average particle size of the resulting diamond film can be maintained at a small value.

Diamond crystals are gradually grown starting from the nucleus-generating point to grow in parallel to the surface of the substrate until they are brought into contact with adjacent diamond crystals.

In case where adhesion is required, such as in tools, heating at high temperatures of 950° C. or more higher than 600° C. leads to the production of high adhesion between the diamond film and the substrate.

Further another special feature of the present invention is that since the diamond film obtained according to the present invention is grown at a high-speed, it can be used also as bulky diamond. Various kinds of application can be expected for bulky diamond on account of a superior transmitted of infrared rays and the like including the application as a transmissive material. Of these applications, the application as a semiconductor is greatly expected. Boron (B), phosphorus (P), sulfur (S), arsenic (As), antimony (Sb) and the like are superior as a dopant for semiconductor diamond but according to the method of the present invention, a bulky diamond material having a functionality can be easily synthesized by forming an atmosphere containing these elements.

On the other hand, homogeneous diamond particles having a uniform shape can be easily obtained by adjusting the nucleus-generating density in the initial deposition stage using this art.

Operation

Figure 2:
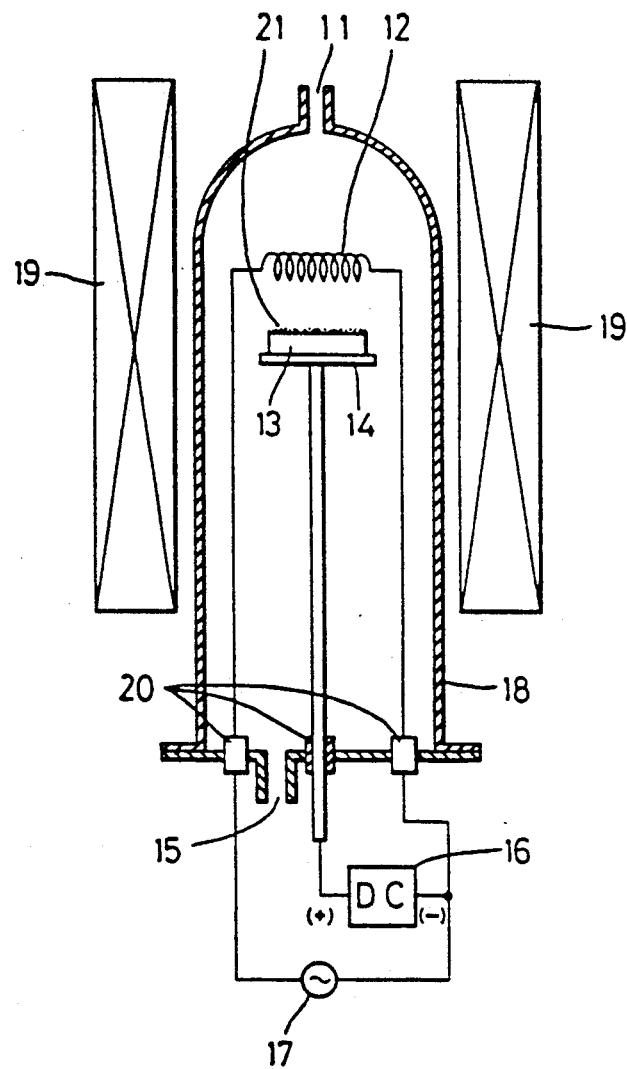

The present invention will be below described in detail with reference to the following drawings, in which FIG. 1 is a schematic drawing showing the DC plasma thermal filament CVD method in which a CA thermocouple fine wire is brought into a point contact with a substrate in order to control a surface temperature of the substrate in the present invention; and FIGS. 2, 3 are a front view showing one example of an apparatus for carrying out a method of the present invention.

Figure 4:
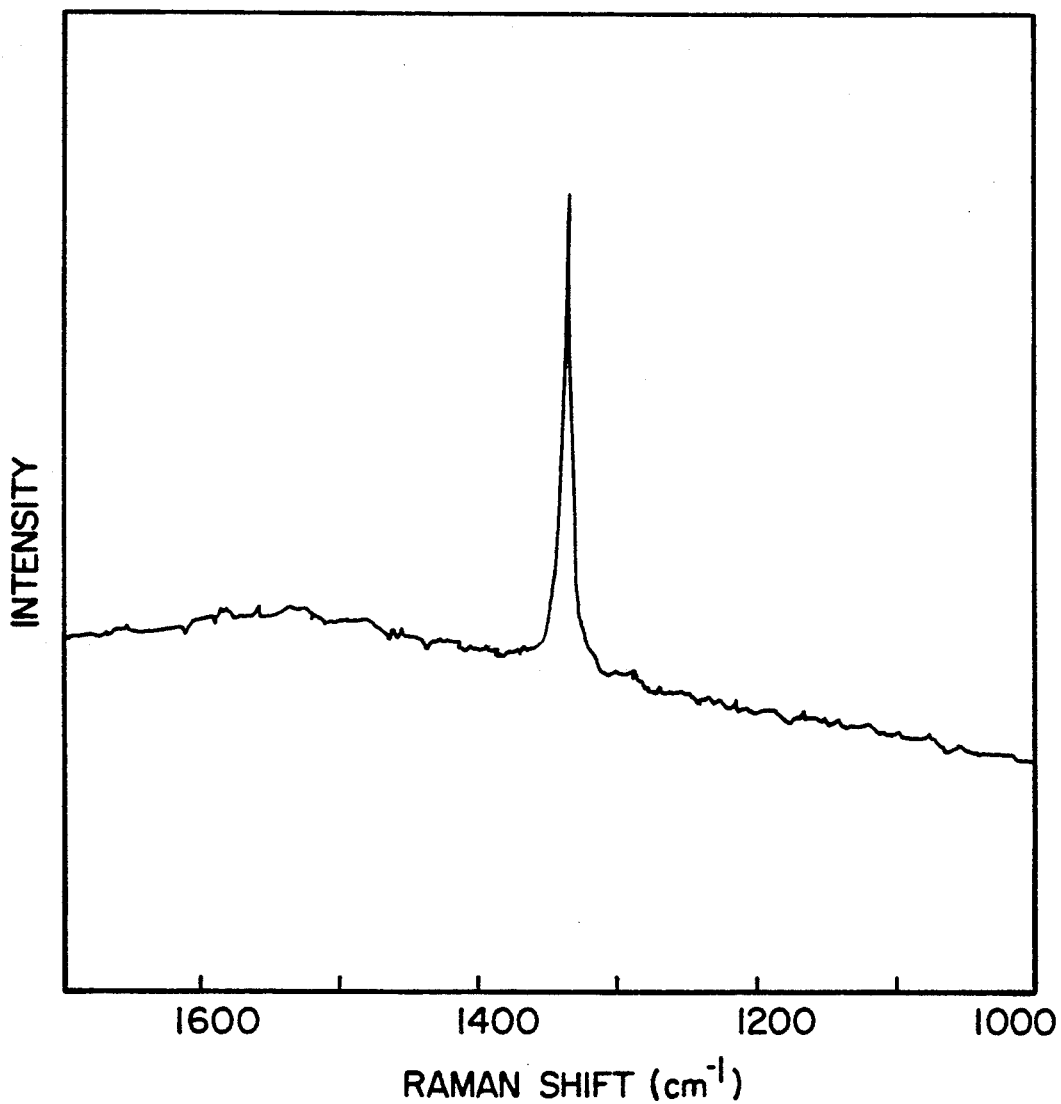

FIG. 4 is a chart according to the Raman spectrometric method showing intensity of diamond film obtained by the present invention.

In one preferred embodiment of the apparatus used for carrying out the method of the present invention as shown in FIG. 2, $CH_4$ and $H_2$ are introduced into a reaction tube 18 made of quartz through a raw material gas-introducing port 11 and thermally activated by a thermoelectron-radiating material 12 heated at 1,600° C. or more, the thermoelectron-radiating material 12 being connected to a negative pole while a substrate 13 is connected to a positive pole, by the use of a DC power source 16, a DC plasma being generated between the thermoelectron-radiating material 12 and the substrate on a substrate-supporting table 14, and the activation of the raw material gas being promoted by the formation of plasma in addition to the activation by the thermoelectron-radiating material. Referring to FIG. 2, reference numeral 15 designates a vaccum exhaust port, reference numeral 17 designating an AC power source for heating the thermoelectron-radiating material, reference numeral 19 designating an outside heating furnace, reference numeral 20 designating an insulating seal, and reference numeral 21 designating a plasma generated.

On the other hand, FIG. 3 shows an apparatus having a construction fundamentally the same as that shown in FIG. 2 excepting that a substrate-supporting table 22 is devised, various kinds of coolant (for example, water, $H_2$, He, oils, liquefied nitrogen and the like) flowing through the reaction tube from the outside, and the cooling capacity being changed, whereby the surface temperature of the substrate can be freely adjusted. Reference numerals in FIG. 3 which are the same as in FIG. 2 designate the same parts as in FIG. 2.

A method technically akin to the present invention has been disclosed in Japanese Patent Publication Laid-Open No. Sho 60-221395, in which diamond is synthesized by exposing a substrate to a shower of electrons by the use of a direct current power source in addition to the thermal filament method. It has been said that the growth speed is increased and diamond having a high completeness can be obtained by the use of this method. Since in this method a plasma is not used but a shower of electrons is used, it is characterized by the fact that a suitable value of an electron current passing through between the filament and the substrate is provided at a small value of 20 to 30 mA based on a substrate size of 25 to 100 $mm^2$. On the contrary, according to the present invention, a plasma, of which generating condition can be clearly confirmed, is formed. That is to say, the present invention is greatly different from the above described Japanese Patent Publication Laid-Open No. Sho 60-221395 in not only the above described suitable value of the electron current flowing through between the filament and the substrate, but also that a large plasma current density of 50 to 1,000 $mA/cm^2$ is used.

Another great special feature of the present invention is in that a pressure in the formation of plasma is selected at a remarkably high range to an extent of 50 to 500 Torr, contrary to conventional common sense of DC plasma.

Diamond obtained by the thermoelectron-radiating material CVD method is inferior to diamond obtained by the microwave plasma CVD method in film quality. That is to say, although a reason why diamond obtained by the thermoelectron-radiating material CVD method contains carbon having a construction other than diamond at a ratio larger than diamond obtained by the microwave plasma CVD method is not clear, it appears that a concentration of hydrogen radical having an action of selectively removing carbon other than diamond depositing together with diamond in the thermoelectron-radiating material CVD method is smaller than in the microwave plasma CVD method.

In addition, it appears that also a concentration of a metal radical having a $SP^3$ hybrid orbit thought to be necessary for the formation of diamond in the thermoelectron-radiating material CVD method is smaller than in the microwave plasma CVD method. In addition, it appears that since the activation of a raw material gas is carried out by merely the thermal decomposition in the thermoelectron-radiating material CVD method, ions do not exist in an activated species differently from a case where a plasma is formed, and also the concentration of the formed radical is low which is thought to be disadvantageous for the synthesis of diamond having a high completeness.

On the contrary, according to a method for synthesizing diamond of the present invention, it is thought that an excitation level of the raw material gas is remarkably improved by using a DC discharge plasma in addition to the thermal decomposition of the raw material gas by the thermoelectron-radiating material heated at a high temperature, whereby the activation of the reaction gas by the decomposition and excitation can be still more promoted, and an energy of the activated raw material gas is increased, and a rate of the activated gas is increased, and a useful life time of the activated gas is prolonged, so that the deposition of graphite and amorphous carbon having a construction other than that of diamond is suppressed thereby obtaining a diamond film having a high completeness.

Besides, the present invention is characterized by that the formation of DC discharge plasma is carried out in an arc discharge range of 50 to 500 Torr in which the DC glow discharge is usually not generated. Since thermoelectrons can be easily taken out from the thermoelectron-radiating material by connecting the thermoelectron-radiating material to a negative pole while the substrate is connected to a positive pole and applying a voltage by the use of a DC power source, the DC glow discharge can be stably maintained at such a high pressure. A plasma formed at such a high pressure is characterized by that a difference between an electron temperature and a gas temperature is reduced and the gas temperature is raised in comparison with those of a plasma formed at a low pressure.

According to the present invention, it is essential for the manufacture of diamond having a high completeness to form a plasma under such conditions although the reason for this has not always been made clear.

In the present invention, solid carbon or hydrocarbon or hydrocarbons containing O and N in a bonding group or carbon tetrachloride can be used as the carbon source. In addition, a mixture of the above described carbon sources and hydrogen can be used as the raw material gas. In the case where solid carbon is used as the carbon source, carbon is preferably used as the thermoelectron-radiating material.

Besides, Ar, Kr, Xe, Rn and $N_2$, which do not take part in the reaction, other gases may be used in combination as the gas to be introduced into the reaction vessel. Since these gases have low thermal conductivity, they can be used as a coolant gas for the substrate and have also an action of adjusting the strength of plasma.

Since a superior thermoelectron-radiating capacity, a low vapour pressure at a high temperature and a high melting point are required for the thermoelectron-radiating material, high-melting point metals, such as W, Ta and Mo, $LaB_6$, graphite and the like are preferably used.

In addition, the thermoelectron-radiating material can be used in the form of spiral filament, a plurality of linear filaments extended in parallel, tensioned linear filaments, linear filaments combined in mesh and uniform thermoelectron-radiating electrode having a large area.

The thermoelectron-radiating material is heated at 1,600° C. or more when used. If thermoelectron-radiating material is used at temperatures lower than 1,600° C., graphite and amorphous carbon are predominantly deposited. In addition, in order to stably generate and maintain a plasma at a pressure of 50 Torr or more, the thermoelectron-radiating material is preferably heated at a higher temperature because a sufficient amount of electrons is required to be radiated.

The pressure within the reaction vessel is preferably selected at 50 Torr or more but 500 Torr or less. If the pressure exceeds 500 Torr, the stable maintenance of the plasma becomes difficult. On the contrary, if the pressure is lower than 50 Torr, a gas temperature within the formed plasma is lowered, whereby the manufacture of diamond having a high completeness, which is an effect of the present invention, can not be attained. The reason for this has never always been made clear but it appears that activated species formed by the generation of a plasma are different in kind and concentration. An increase of the gas pressure is effective also for increasing the nucleus-forming density of diamond. In particular, it is desirable for a diamond film for use in a cutting tool that an adhesion between the substrate and the diamond film is large and in order to increase the adhesion between the substrate and the diamond film, a high-temperature treatment is preferably carried out. However, if the coating conditions of diamond are selected so as to raise the surface temperature, the nucleus-forming density is reduced, so that it becomes difficult to form a diamond film comprising fine particles at a pressure of 50 Torr or less also in view of the high-temperature treatment.

It is one of the most important constituent factors that the DC plasma has a suitable strength range. The preferable electric power density is 5 $W/cm^2$ or more but 200 $W/cm^2$ or less but it is not restrictive if a substrate-cooling measure is taken. The strength of the DC plasma is dependent upon a gaseous atmosphere, shape of filament, shape of substrate, shape of substrate-supporting table, shape of counter-pole, arrangement of filament relative to a counter-pole, temperature of filament, output of DC power source and the like. In addition, as to a plasma-generating state, a plasma-radiating state is observed in a slight range adjacent to a surface of the supporting table including it at a pressure exceeding 50 Torr in the case where the substrate and the supporting table are larger than the substrate, so that it is preferable that the strength of a plasma is expressed by a direct current electric power applied onto a unit area of the surface exposed to the plasma. If the electric power is smaller than 5 $W/cm^2$, the film quality-improving effect of the present invention resulting from the simultaneous use of DC plasma is reduced, and on the contrary, if the electric power is larger than 200 $W/cm^2$, an effect of plasma-etching is increased, whereby the deposition rate of diamond is remarkably reduced.

In addition, the simultaneous use of DC plasma has an effect of remarkably finding the crystalline particles in the formed diamond film and this effect is increased with an increase of the electric power applied. Usually, the treatment at a high temperature leads to an enhancement of a growth speed of diamond particles and the formation of a diamond film comprising rough and large crystalline particles, but the treatment at a high gas pressure in addition to the simultaneous use of DC plasma lead to such an astonishing effect that a fine structure of 0.3 microns can be obtained even at a high treatment temperature exceeding 1,000° C.

Since it is efficient for the improvement of performances to form a fine film even at a high temperature in the case of a cutting tool, the application of a diamond film according to the present invention leads to an epoch-making improvement of performances of cutting tools in comparison with those of the conventional cutting tools obtained by the conventional coating method.

Also as to an electric resistance, a diamond film formed by the conventional w-filament CVD method was inferior to that formed by the microwave plasma CVD method but according to the present invention, an electric resistance was remarkably increased and a diamond film, which was superior to that obtained by the microwave plasma CVD method, could be obtained.

In addition, since the present invention is similar to the thermoelectron radiating material CVD method in fundamental construction of an apparatus, a plural treatment and a large area-coating are possible by using a plurality of filaments. That is to say, a method according to the present invention is a coating process sufficiently having a mass productivity also.

In addition, according to the present invention, diamond having an excellent shape and a remarkably high completeness and hardly containing impurities other than diamond, such as amorphous carbon, can be deposited in high-speed to manufacture a bulk material of polycrystalline diamond.

It is thought that it is necessary for the high-speed coating of diamond only to increase a concentration of carbon as a raw material of diamond in the reaction system, thereby increasing a supersaturation ratio of diamond. Concretely speaking, for example in a system of $H_2$ and $CH_4$, it is necessary for increasing a partial pressure of methane only to increase a concentration of methane or a total pressure.

However, in general, according to the thermoelectron-radiating material CVD method and the microwave plasma CVD method, in the case where $H_2$ and $CH_4$ are used as raw material sources, diamond having an excellent shape can be synthesized at a $CH_4$-concentration of several % or less and a pressure of 100 Torr or less. If the concentration of $CH_4$ and the pressure are increased higher than the above described values, the synthesis of diamond having an excellent shape and hardly containing amorphous carbon becomes impossible. A reason for this appears to be that a ratio of methyl radical and atomic hydrogen generated by exciting and activating the raw material gas is not a suitable condition of synthesizing diamond.

However, in the process using the thermal activation by the thermoelectron-radiating material heated at an extremely high temperature together with the activation by the DC plasma according to the present invention, diamond having an excellent shape can be synthesized even though the pressure is several hundreds Torr and a ratio of the number of carbon atoms to the number of hydrogen atoms contained in the raw material gas exceeds 1% (for example $CH_4$ of 2% in a $H_2$-$CH_4$ system) by selecting the temperature of the thermoelectron-radiating material at 2,200° C. or more, selecting the DC electric power applied at 50 W/cm$^3$ or more per unit volume of plasma-forming space, and maintaining the temperature of the heated substrate at 850° C. or more but 1,100° C. or less by adjusting the cooling capacity of the supporting table. Astonishingly, this is possible until the above described ratio of 10%. The high-speed coating showing a deposition speed of 20 microns/hr or more is possible at such a high carbon-concentration.

In addition, since the nucleus-forming density is remarkably increased, a fine film can be obtained at a high temperature without applying a grating treatment to the substrate.

As a result, a superthin film of about 0.1 microns thick can be formed.

As to a reason for this, it appears that since a large electric power is applied at a high pressure to generate a plasma having a high energy-density and a temperature of the thermoelectron-radiating material higher than that in the conventional method is used, also a level of the thermal activation is increased and the ability or capability of exciting and activating the raw material gas is remarkably improved, so that methyl radical and atomic hydrogen are formed in a large quantity with maintaining a suitable balance therebetween. This is contrary to the conventional method in which a ratio of the formed methyl radical to atomic hydrogen is outside the suitable range, whereby the synthesis of diamond having an excellent range and hardly containing amorphous carbon has been impossible with an increased quantity of carbon in the raw material gas. As a result, in the present invention the synthesis of diamond having an excellent shape and a remarkably high completeness and hardly containing amorphous carbon becomes possible.

In addition, since the DC plasma having high energy-density generated by applying a large electric power at a high pressure according to the present invention is distributed not only on a surface of the substrate but also in a space between the surface of the substrate and the thermoelectron-radiating material, the DC electric power to be applied is preferably prescribed by an electric power per unit volume of the plasma-forming space. The effect of the present invention can not be achieved clearly until the DC electric power is selected at 50 W/cm$^3$, that is to say the high-speed coating at a rate of 20 microns/hr or more is impossible.

Besides, if the ratio of the number of carbon atoms to the number of hydrogen atoms in the raw material gas is less than 1%, the high-speed coating becomes impossible similarly even though the excitation level is high. On the contrary, if said ratio exceeds 10%, the synthesis of diamond having a high completeness becomes impossible.

Furthermore, if the temperature of the thermoelectron-radiating material is lower than 2,200° C., the plasma having a high energy-density is difficult to stably maintain at such a high pressure.

In addition, in order to synthesize diamond having an excellent shape and hardly containing amorphous carbon, the surface temperature of the substrate is preferably selected at 850° C. or more but 1,100° C. or less. If the surface temperature of the substrate is outside this range, the content of amorphous carbon is increased.

Since the present invention has an advantage in that the nucleus-forming density of diamond is remarkably increased in addition to the above described advantage that the high-speed coating of diamond becomes possible, the pretreatments of the substrate, such as grating and etching, which have been required in the prior art methods, become quite unnecessary, whereby a uniform and fine (having a particle size of 1 micron or less) diamond film can be synthesized even on a mirror-finished single crystalline Si wafer.

In addition, since the nucleus-forming density is remarkably large, also the synthesis of continuous thin film of 0.1 microns thick is possible. Accordingly, it can be said that the present invention is a method which is advantageous for the synthesis of a remarkably thin film.

Besides, one of special features of the present invention is in that the thermoelectron-radiating material is used as a thermal cathode for generating a DC plasma having a high energy-density. The construction of the thermal cathode can be freely modified and also an electrode having a large area can be easily used. Accordingly, a large excitation source having a high excitation ability or capability can be produced in a space, whereby large-area high-speed coating and uniform high-speed coating are possible. Moreover, it can be said that the present invention is an industrially very valuable process in view of remarkably simple construction of an apparatus and inexpensiveness of the apparatus itself.

(Preferred Embodiments)

The present invention is below described in detail with reference to the preferred embodiments.

EXAMPLE 1

A Mo plate (10 mm × 10 mm × 1 mm) as a substrate, of which the surface was polished with diamond abrasive grains #5000, was coated with diamond in an apparatus as shown in FIG. 2. At first, the inside of a reaction vessel was evacuated to $10^{-3}$ Torr or less and then a gaseous mixture comprising $CH_4$ and $H_2$ at a ratio of 1:100 was introduced into the reaction vessel as a raw material gas at a rate of 200 ml/min. Subsequently, a surface temperature of the substrate was adjusted to 980° C. by heating a W-filament used as a thermoelectron-radiating material at 2,000° C. or more and simultaneously using an outside heating furnace while maintaining a pressure within the reaction vessel at an appointed value. The distance between the filament and the substrate was selected at 8 mm. Subsequently, an appointed electric power was applied from a DC power source. Since the application of the electric power leads to a rise of the substrate temperature, the filament temperature was reduced to maintain the substrate temperature constant. A coating time was selected at 5 hours. The coating conditions and the characteristics of the coated film are shown in Table 1.

TABLE 1

| Sample No. | Pressure (Torr) | Electric power applied (W) | Electric resistance (ohm cm) | Crystal grain (micron) | Notes |
|---|---|---|---|---|---|
| 1* | 30 | 50 | $10^9$–$10^{10}$ | 2–3 | |
| 2 | 50 | 50 | $10^{12}$–$10^{13}$ | 0.7–1.5 | |
| 3* | 100 | 0 | $10^4$–$10^5$ | 3–5 | |
| 4 | 200 | 5 | $10^{10}$–$10^{11}$ | 1–2 | |
| 5 | " | 50 | $10^{12}$–$10^{13}$ | 0.5–1 | |
| 6 | " | 150 | " | 0.1–0.3 | |
| 7 | " | 250 | — | — | 1) |
| 8 | 300 | 50 | $10^{12}$–$10^{13}$ | 0.3–0.7 | |
| 9 | 400 | 50 | " | " | |
| 10 | 500 | 100 | " | 0.5–1 | |
| 11* | 550 | " | — | — | 2) |
| 12* | 40 | microwave electric power: 300 W | $10^9$–$10^{10}$ | 2–3 | |
| 13* | 40 | 2 | $10^9$–$10^{10}$ | 3–5 | |

In addition, for comparison, the same Mo-substrate was coated for 5 hours at a pressure of 40 Torr, an electric power of microwave of 300 W and a surface temperature of the substrate of 980° C. similarly, as shown in Table 1, in a microwave plasma CVD apparatus of 2.45 GHz, into which a gaseous mixture comprising $CH_4$ and $H_2$ at a ratio of 1:100 was being introduced at a rate of 200 ml/min. The characteristics of the obtained film are comparatively shown in Table 1. In addition, an electric resistance of a diamond film was determined by measuring V-I characteristics between an electrode produced by coating a first Ti layer and a second Au layer on the diamond film by means of an ion-plating apparatus to form an ohmic contact and the Mo-plate as the substrate as the other electrode.

The mark * shows a comparative example in Table 1. Since in the sample No. 3 an electric power applied is zero, this corresponds to the sample obtained by the thermoelectron-radiating material CVD method. The sample No. 12 was obtained by the microwave plasma CVD method and the sample No. 13 was obtained by the CVD method using an electron shower.

It is found from Table 1 that an electric resistance of a diamond film is remarkably increased as a result of an effect of the simultaneous use of plasma by comparing the sample No. 3 with other samples. In addition, it is found that a diamond film having a high electric resistance exceeding that of a diamond film obtained by the microwave plasma CVD method such as the sample No. 12 can be obtained. It was found from the results of a Raman spectrometric analysis that the sample No. 3 without simultaneously using a plasma contains amorphous carbon but the samples obtained by simultaneously using a plasma do not contain amorphous carbon. In addition, as to an influence of a pressure at the same plasma-electric power, it was found from the comparison of the samples No. 1, 2, 5, 8 and 9 that a particle size of a diamond film is reduced with an increase of pressure. In addition, it is found from the comparison of the samples No. 4, 5 and 6 that a particle size of crystals is reduced with an increase of an electric power applied and a strength of plasma. Accordingly, a fine structure can be obtained even at a high temperature by controlling the pressure and strength of plasma.

It has been remarkably difficult in the microwave plasma CVD method to obtain such a fine structure at a high temperature.

Note 1) in Table 1 denotes "due to slow deposition speed, film is not formed".

Note 2) denotes "plasma stability can not be maintained".

FIG. 4 shows a chart of intensity according to Raman spectrometric method regarding diamond film obtained by sample No. 6 of the Table above.

EXAMPLE 2

This example exhibits effects in that since an apparatus is similar to that in the thermoelectron-radiating material CVD in fundamental construction, a plural treatment and a large area coating are possible by using a plurality of thermoelectron-radiating material in addition to the possibility of synthesizing diamond having a remarkably high completeness exceeding that in the microwave plasma CVD method.

The coating onto a Mo-substrate of 300 mm × 150 mm × 10 mm was carried out by the use of 30 pieces of thermoelectron-radiating material the same as in Example 1. The Mo-substrate was finished by grinding using a diamond grindstone #600. In order to control a temperature of respective thermoelectron-radiating materials in high accuracy, heating power sources were provided independently so that the control may be independently carried out for respective thermoelectron-radiating materials. But, one side of the electrodes was commonly used for the connection of a DC power source.

At first, the inside of a reaction vessel was evacuated to $10^{-3}$ Torr or less and then a gaseous mixture comprising $CH_4$ and $H_2$ at a ratio of 1:100 was introduced into the reaction vessel as a raw material gas at a rate of 200 ml/min. Subsequently, a surface temperature of the substrate was controlled at a range of 900° to 920° C. by maintaining a pressure within the reaction vessel at 100 Torr, heating a W-filament as thermoelectron-radiating material at 2,000° C. and simultaneously using an outside heating furnace. Then, a voltage of 200 V was applied by means of the DC power source to obtain a plasma electric current of 80 A. That is to say, an electric power of 35.5 W/cm² was applied. Since the application of this electric power leads to a rise of the temperature of the substrate, in order to maintain the substrate-temperature constant, a filament-temperature was lowered to control the substrate-temperature. A coating time was selected at 4 hours.

As a result, a diamond film having an average thickness of 10 microns was obtained. The fluctuation of film-thickness was 10% or less. In addition, the obtained diamond film was remarkably superior in quality, that is to say the size of crystalline particles was 0.5 to 1.0 microns and the electric resistance was $10^{11}$ to $10^{12}$ ohm cm. Accordingly, it was found that diamond having a remarkably high completeness and a fine structure could be uniformly coated on a large area.

EXAMPLE 3

Diamond was coated on a substrate formed of ISO K-10 carbide alloy (WC-5% Co) type # SPG 422 on the market in the same apparatus as in Example 1. At first, a reaction vessel was evacuated to $10^{-3}$ Torr or less and then a gaseous mixture comprising $CH_4$ and $H_2$ at a ratio of 1:100 was introduced as a raw material gas at a rate of 200 ml/min. Subsequently, a pressure within the reaction vessel was maintained at 100 Torr. Then, a surface temperature of thermoelectron-radiating material was once raised to 950° C. by using a W-filament as the thermoelectron-radiating material, heating it at 2,000° C. or more and simultaneously using an outside heating furnace. Subsequently, an electric power applied by a direct current power source was adjusted to 80 W and the surface-temperature of the substrate was adjusted to 950° C. by connecting the filament to a negative pole, connecting a tip to be cut to a positive pole and letting a DC plasma start to control a voltage applied and a filament-electric current at the same time. The distance between the filament and the substrate-surface was selected at 10 mm. A diamond film of 7 microns thick was obtained after the coating process for 3 hours. The particle size of this diamond film was 0.5 to 1 microns. This substrate is called A. On the other hand, a diamond film of 7 microns thick was obtained after the coating process for 5 hours while controlling a surface-temperature of a substrate to 950° C. by merely heating a W-filament without simultaneously using a DC plasma. The particle size of this diamond film was 3 to 5 microns. This substrate is called B. In addition, an untreated substrate without coating diamond thereon was prepared for comparison. This untreated substrate is called C.

These tips to be cut were tested under the following cutting conditions:

| Material to be cut | Al-12% Si alloy |
| --- | --- |
| Cutting speed | 800 m/min |
| Feed | 0.1 mm/rev |
| Depth of cut | 0.2 mm |
| Holder | FR11R-44A |

As a result, uncoated C exhibited the frank abrasion of 0.35 mm after 15 seconds and also a material to be cut exhibited a great deposition while the substrate B exhibited the frank abrasion of 0.12 mm after 30 minutes. In addition, the substrate A obtained by simultaneously using the DC plasma according to the present invention exhibited the frank abrasion of 0.05 mm after cutting for 30 minutes. That is to say, a remarkable effect of simultaneously using a DC plasma was confirmed.

EXAMPLE 4

Diamond was coated on a Mo-plate (20 m × 20 m × 2 mm) as a substrate finished by grinding using diamond grindstone #600 in an apparatus roughly shown in FIG. 3.

At first, the inside of a reaction vessel was evacuated to $10^{-3}$ Torr or less and then a gaseous mixture comprising $CH_4$ and $H_2$ was introduced into the reaction vessel at a rate of 300 ml/min. A Ta-filament used as a thermoelectron-radiating material was heated at 2,200° C. or more while maintaining a pressure within the reaction vessel at an appointed value. Subsequently, an electric power of an appointed value was applied by means of a DC power source to generate a DC high-density energy plasma and a cooling capacity of a substrate-supporting table was changed while maintaining a temperature of the filament unchanged to adjust a surface-temperature of a substrate to 950° C. A coating time was selected at 1 hour. Coating conditions and measurement results of a thickness of the coated film are shown in Table 2.

TABLE 2

| Sample No. | $CH_4$- conc. (%) | Pressure (Torr) | DC electric power (W/cm³) | Filament- temperature (°C.) | Thickness of diamond film (micron) |
| --- | --- | --- | --- | --- | --- |
| 14 | 3 | 200 | 250 | 2,200 | 20 |
| 15 | 3 | 200 | 200 | 2,300 | 25 |
| 16 | 3 | 200 | 200 | 2,400 | 30 |
| 17 | 4 | 200 | 250 | 2,400 | 45 |
| 18 | 6 | 150 | 300 | 2,400 | 60 |
| 19 | 6 | 150 | 200 | 2,500 | 60 |
| 20 | 8 | 150 | 250 | 2,500 | 75 |
| 21 | 10 | 150 | 300 | 2,500 | 100 |
| 22 | 2 | 40 | Microwave electric power: 300 W | — | 6 |

In addition, the same Mo-substrate was subjected to a coating process for 5 hours in a microwave plasma CVD apparatus of 2.45 GHz at a pressure of 40 Torr, microwave electric power of 300 W and surface-temperature of the substrate of 950° C., as shown in the sample No. 22 in Table 2 while introducing a gaseous mixture comprising $CH_4$ and $H_2$ at a ratio of 2:100 into the reaction vessel at a rate of 200 ml/min. Also the measurement results of a thickness of the coated film are shown in Table 2.

As described in the Examples, diamond can be synthesized at a surprisingly high speed by generating a DC high energy density plasma between a thermal cathode formed of a thermoelectron-radiating material heated at a superhigh temperature and a substrate at a high pressure and thermally activating and activating by the use of a plasma a raw material gas containing a carbon source in high concentration.

EXAMPLE 5

A diamond film was formed on a material obtained by coating TiC on a steel plate of 10 cm × 10 cm in an apparatus as shown in FIG. 3. At first, the inside of a reaction vessel was evacuated to $10^{-4}$ Torr and then a gaseous mixture comprising $C_2H_6$ and $H_2$ at a ratio of 8:100 and $B_2H_6$ at 1,000 ppm was introduced into the reaction vessel at a rate of 500 ml/min.

An electric power was set at 2,000 W by maintaining the pressure within the reaction vessel at 250 Torr, using a filament made of Ta, heating it at 2,300° C., and then connecting the filament to a negative pole and the substrate to a positive pole, making a DC plasma start, and adjusting a voltage applied and filament electric current at the same time.

In addition, a surface-temperature of the substrate was adjusted to 850° C. and a diamond film was synthesized for 2 hours.

The obtained diamond film had a thickness of 70 microns and contained boron (B) therein.

EXAMPLE 6

Diamond was coated on a substrate in the apparatus as shown in FIG. 3 using materials as shown in Table 3 under the conditions as also shown in Table 3.

At first, the inside of a reaction vessel was evacuated to $10^{-3}$ Torr or less and then a gaseous mixture comprising a raw material gas (carbon source) and other gases at a ratio as shown in Table 3 was introduced into the reaction vessel at a rate of 200 ml/min. Subsequently, a thermoelectron-radiating material was heated while maintaining a pressure within the reaction vessel at an appointed value to adjust a surface-temperature of a substrate. The distance between a filament and the substrate was selected at 10 mm.

Subsequently, an appointed electric power was applied for 2 hours from a DC power source to obtain a diamond film having a high completeness and a film-thickness as shown in Table 3.

The diamond film obtained in this example was tested for cutting using a carbide alloy (WC-5% Co) prescribed by K-10 of ISO Standard, sintered body mainly comprising $Si_3N_4$ and W as the substrate, selecting a shape of Model No. SPG 422, and adjusting a coating time so that the film-thickness may amount to 6 microns. The results are shown in Table 3.

The cutting conditions were selected as follows:

| Material to be cut | Al-8% Si |
|---|---|
| Cutting speed | 1,800 m/min |
| Feed | 0.1 mm/rev |
| Depth of cut | 0.2 mm |
| Cutting time | 2 hours |

The evaluation was carried out on the basis of a quantity of abrasion.

In the results of the cutting test, the quantity of abrasion is increased in the order of ⊚, ○, △, × from a tool coated with a diamond film to that which is not coated with a diamond film. × exhibited merely a performance equal to a tool which is not coated with a diamond film.

On the other hand, in the Comparative Examples No. 37 and No. 38 marked with * in Table 3 an amorphous carbon film was obtained.

TABLE 3

| Sample No. | Carbon source | Other gas | Carbon source/Other gas | Thermoelectron radiating material Kind of material | Thermoelectron radiating material Temperature (°C.) | Substrate-temperature (°C.) | Substrate material |
|---|---|---|---|---|---|---|---|
| 23 | $CH_4$ | $H_2$ | 0.3/100 | W | 1650 | 850 | WC-5% Co |
| 24 | " | " | 0.5/100 | " | 2000 | 600 | " |
| 25 | " | " | " | " | " | 750 | " |
| 26 | " | " | " | " | " | 900 | " |
| 27 | $CH_3COCH_2$ | " | 1/100 | Ta | 2300 | " | SiC |
| 28 | " | " | 4/100 | " | 2350 | " | " |
| 29 | " | " | 8/100 | " | 2450 | " | " |
| 30 | $(CH_3)_2CN$ | " | 2/100 | W | 2150 | " | WC-5% Co |
| 31 | $CH_4$ | " | 4/100 | " | " | 1050 | " |
| 32 | " | 85% $H_2$-15% Ar | 2/100 | " | " | 900 | Ta |
| 33 | " | 70% $H_2$-30% Xe | 1/100 | " | " | " | " |
| 34 | " | $H_2$ | 4/100 | " | " | 1050 | $Si_3N_4$ |
| 35 | " | " | " | " | " | 1200 | " |
| 36 | Solid C | " | — | C | 2500 | 850 | W |
| 37* | $CH_4$ | " | 0.5/100 | W | 2000 | 550 | WC-5% Co |
| 38* | $CH_3COCH_3$ | " | 15/100 | " | 2450 | 900 | " |

| Sample No. | Pressure (Torr) | DC electric power (W/cm²) | Film thickness (μm) | Result of cutting test |
|---|---|---|---|---|
| 23 | 50 | 50 | 0.5 | ○ |
| 24 | 100 | 40 | 0.9 | △ |
| 25 | " | " | 1.2 | △ |
| 26 | " | " | 2.0 | ⊚ |
| 27 | 250 | 200 | 80 | |
| 28 | " | 250 | 160 | |
| 29 | " | 350 | 220 | |
| 30 | 150 | 50 | 12 | |
| 31 | 300 | " | 10 | |
| 32 | 150 | 30 | 4 | ⊚ |
| 33 | " | " | 2 | ⊚ |

TABLE 3-continued

| 34 | 300 | 50 | 8 | ○ |
|---|---|---|---|---|
| 35 | " | " | 3 | △ |
| 36 | 100 | 30 | 6 | ○ |
| 37* | 50 | 50 | — | × |
| 38* | 250 | 350 | — | × |

EXAMPLE 7

The coating process was carried out in the same manner as in Example 1 excepting that a gaseous mixture introduced in the initial stage comprises CH₄ and H₂ at a ratio of 0.1:100 for 30 minutes and then the reaction was continued for 5 hours with a ratio of CH₄ to H₂ at 1:100 to obtain granular diamond on a Mo-plate. Because when the nucleus-generating density per unit area is reduced in the initial stage and subsequently a quantity of carbon fed is increased, diamond is formed merely on the generated nuclei, so that granular diamond can be obtained in a short time.

Effects of the Invention

As above described, diamond having a completeness higher than that obtained by the thermoelectron-radiating material CVD method and an electric resistance exceeding that obtained by the microwave plasma CVD method can be obtained by using the thermoelectron-radiating material CVD method together with a DC plasma and generating such a plasma at a high gas pressure of 50 Torr or more but 500 Torr or less, so that diamond according to the present invention can be applied to a field of electronic materials requiring a high insulating property.

In addition, a diamond film of a minute particle size can be synthesized even at a high temperature, so that the remarkable improvement of performance can be attained in the fields capable of utilizing mechanical properties of diamond such as cutting tools and abrasion-resisting sliding members.

Besides, according to a method of the present invention, diamond can be synthesized in high-coating speed of 20 microns/hr or more and a bulk material of polycrystalline diamond having an excellent shape and a remarkably high completeness and hardly containing impurities other than diamond such as amorphous carbon can be manufactured.

We claim:

1. A method for synthesizing a diamond film on a substrate in a reaction vessel in a low-pressure gaseous phase, consisting essentially of
    preparing a raw material gas from a carbon source and hydrogen, said carbon source selected from the group consisting of solid carbon, a hydrocarbon, a hydrocarbon containing O or N in a bonding group, and carbon tetrachloride, and
    activating said raw material gas by a thermoelectron-radiating material and by formation of a DC plasma to deposit the diamond film on a surface of the substrate,
    wherein the surface of the substrate is heated from 600° to 1200° C., the thermoelectron-radiating material is heated to at least 1,600° C. and is connected to a negative pole while the substrate to be coated is connected to a positive pole, the DC plasma is formed between the thermoelectron-radiating material and the substrate by applying a direct current voltage from a direct current power source, and a pressure within the reaction vessel, in which the plasma is formed, is set between 100 and 500 Torr.

2. A method for synthesizing a diamond film according to claim 1, further comprising controlling the temperature of the substrate by using a substrate-supporting table having a means for cooling the substrate by flowing a coolant through the substrate-supporting table, wherein the temperature of the substrate can be adjusted by adjusting the flow of coolant in the substrate-supporting table.

3. A method for synthesizing a diamond bulk material on a substrate in a reaction vessel in a low-pressure gaseous phase, comprising
    preparing a raw material gas from a carbon source and hydrogen, said carbon source selected from the group consisting of solid carbon, a hydrocarbon, a hydrocarbon containing O or N in a bonding group, and carbon tetrachloride, and
    activating said raw material gas by a thermoelectron-radiating material and by formation of a DC plasma to deposit the diamond bulk material on a surface of the substrate,
    wherein the surface of the substrate is heated from 850° to 1200° C., the thermoelectron-radiating material is heated to 2,200° C. or more and is connected to a negative pole while the substrate to be coated is connected to a positive pole, the DC plasma is formed between the thermoelectron-radiating material and the substrate by applying a direct current voltage from a direct current power source, the electric power applied for forming the DC plasma is 50 W/cm³ or more per unit volume of DC plasma-forming space, the ratio of carbon atoms to hydrogen atoms in the raw material gas is between 1% and 10%, and a pressure within the reaction vessel, in which the plasma is formed, is between 150 and 500 Torr.

4. A method for synthesizing a diamond bulk material on a substrate in a reaction vessel in a low-pressure gaseous phase, comprising
    preparing a raw material gas from a carbon source and hydrogen, said carbon source selected from the group consisting of solid carbon, a hydrocarbon, a hydrocarbon containing O or N in a bonding group, and carbon tetrachloride, and
    activating said raw material gas by a thermoelectron-radiating material and by formation of a DC plasma to deposit the diamond bulk material on a surface of the substrate,
    wherein the surface of the substrate is heated from 850° to 1200° C., the thermoelectron-radiating material is heated to 2,200° C. or more and is connected to a negative pole while the substrate to be coated is connected to a positive pole, the DC plasma is formed between the thermoelectron-radiating material and the substrate by applying a direct current voltage from a direct current power source, the electric power applied for forming the DC plasma is 50 W/cm³ or more per unit volume of DC plasma-forming space, and a pressure within the reaction vessel, in which the plasma is formed, is between 150 and 500 Torr.

5. A method for synthesizing a diamond film on a substrate according to claim 1, wherein the heating of the substrate surface and the thermoelectron-radiating material is controlled by using a substrate-supporting table having a means for cooling the substrate by flowing a coolant through the substrate-supporting table, and the density of the direct current is 50 W/cm$^3$ or more.

6. A method for synthesizing a diamond bulk material on a substrate in a reaction vessel in a low-pressure gaseous phase according to claim 4, in which the growth rate of diamond is 20 microns per hour or more.

* * * * *